US010217783B2

(12) United States Patent
Borthakur et al.

(10) Patent No.: US 10,217,783 B2
(45) Date of Patent: Feb. 26, 2019

(54) METHODS FOR FORMING IMAGE SENSORS WITH INTEGRATED BOND PAD STRUCTURES

(71) Applicant: SEMICONDUCTOR COMPONENTS INDUSTRIES, LLC, Phoenix, AZ (US)

(72) Inventors: Swarnal Borthakur, Boise, ID (US); Ulrich Boettiger, Garden City, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 300 days.

(21) Appl. No.: 14/681,238

(22) Filed: Apr. 8, 2015

(65) Prior Publication Data

US 2016/0300962 A1 Oct. 13, 2016

(51) Int. Cl.
*H01L 27/146* (2006.01)
*H04N 9/04* (2006.01)

(52) U.S. Cl.
CPC .... *H01L 27/14621* (2013.01); *H01L 27/1463* (2013.01); *H01L 27/1464* (2013.01); *H01L 27/14623* (2013.01); *H01L 27/14636* (2013.01); *H01L 27/14645* (2013.01); *H01L 27/14685* (2013.01); *H01L 27/14689* (2013.01); *H04N 9/045* (2013.01)

(58) Field of Classification Search
CPC ............... H01L 27/14601; H01L 27/14621
See application file for complete search history.

(56) References Cited

U.S. PATENT DOCUMENTS

| | | | |
|---|---|---|---|
| 6,630,736 B1 | 10/2003 | Ignaut | |
| 7,294,524 B2 | 11/2007 | Park | |
| 8,247,852 B2 | 8/2012 | Tai et al. | |
| 8,344,471 B2 | 1/2013 | Tseng et al. | |
| 8,405,182 B2 | 3/2013 | Chou et al. | |
| 8,431,429 B2 | 4/2013 | Tai et al. | |
| 8,497,536 B2 | 7/2013 | Chen et al. | |
| 8,536,044 B2 | 9/2013 | Li et al. | |

(Continued)

OTHER PUBLICATIONS

Borthakur et al., U.S. Appl. No. 14/254,196, filed Apr. 16, 2014.
(Continued)

*Primary Examiner* — Jamie C Niesz
(74) *Attorney, Agent, or Firm* — Treyz Law Group, P.C.; Joseph F. Guihan

(57) ABSTRACT

An imaging system may include an image sensor die, which may be backside illuminated (BSI). A light shielding layer and a conductive layer may be formed in the image sensor die. First and second portions of the conductive layer may be electrically isolated, so that the second conductive portion may be coupled to other power supply signals through a bond pad region, while the light shield may be shorted to ground. Optionally, the first and second portions may both be coupled to ground. The light shield may also be shorted through the bond pad region in a continuous conductive layer. A through oxide via may be formed in the image sensor die to couple metal interconnect structures to the conductive layer. Color filter containment structures may be formed over active image sensor pixels on the image sensor die, which may be selectively etched to improve planarity.

15 Claims, 7 Drawing Sheets

(56) References Cited

U.S. PATENT DOCUMENTS

| | | |
|---|---|---|
| 8,536,672 B2 | 9/2013 | Chang et al. |
| 8,569,856 B2 | 10/2013 | Qian et al. |
| 8,597,074 B2 | 12/2013 | Farnworth et al. |
| 8,664,736 B2 | 3/2014 | Tsai et al. |
| 8,680,635 B2 | 3/2014 | Tseng et al. |
| 8,697,472 B2 | 4/2014 | Weng et al. |
| 8,736,006 B1 | 5/2014 | Tsai et al. |
| 8,796,805 B2 | 8/2014 | Ting et al. |
| 8,803,271 B2 | 8/2014 | Liu et al. |
| 9,202,841 B1 * | 12/2015 | Xing ................. H01L 27/14621 |
| 2010/0238331 A1 * | 9/2010 | Umebayashi ..... H01L 27/14632 |
| | | 348/294 |
| 2012/0313208 A1 * | 12/2012 | Kim ................. H01L 27/14634 |
| | | 257/435 |
| 2013/0001728 A1 | 1/2013 | Amicis |
| 2013/0068929 A1 | 3/2013 | Solhusvik et al. |
| 2013/0070109 A1 | 3/2013 | Gove et al. |
| 2013/0221470 A1 | 8/2013 | Kinsman et al. |
| 2013/0328151 A1 | 12/2013 | Kao |
| 2014/0055654 A1 | 2/2014 | Borthakur et al. |
| 2014/0061842 A1 * | 3/2014 | Ting ................. H01L 27/14623 |
| | | 257/448 |
| 2014/0167197 A1 | 6/2014 | Jangjian et al. |
| 2014/0199804 A1 | 7/2014 | Tsai et al. |
| 2014/0263962 A1 * | 9/2014 | Ahn ................. H01L 27/14618 |
| | | 250/208.1 |

OTHER PUBLICATIONS

Borthakur et al., U.S. Appl. No. 14/270,233, filed May 5, 2014.
Borthakur et al., U.S. Appl. No. 14/191,965, filed Feb. 27, 2014.

* cited by examiner

METHODS FOR FORMING IMAGE SENSORS WITH INTEGRATED BOND PAD STRUCTURES

BACKGROUND

This relates generally to imaging systems, and more particularly to imaging systems with bond pad structures.

Modern electronic devices such as cellular telephones, cameras, and computers often use digital image sensors. Imaging systems (i.e., image sensors) often include a two-dimensional array of image sensing pixels. Each pixel typically includes a photosensitive element such as a photodiode that receives incident photons (light) and converts the photons into electrical signals. The imaging system contains an image sensor die with an image sensor integrated circuit and an array of photodiodes.

Circuitry within the image sensor die is typically coupled to a bond pad that interfaces with external components. A first passivation layer is formed over the bond pad to passivate the bond pad. This passivation layer is then opened to allow wirebonding. After the passivation layer is formed, an array of color filter elements is formed on the image sensor die. An array of microlenses is then formed over the array of color filter elements. The color filter and microlenses are formed on the wafer surface through a spin-on process. Due to the topography of the bond pad and the passivation layers the spin-on process creates streaks and other artifacts on the wafer. This results in lower yield. Therefore, this process of forming image sensor dies is inefficient and costly and often results in image sensors that suffer from planarity issues.

It would therefore be desirable to provide improved ways of manufacturing image sensor dies.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
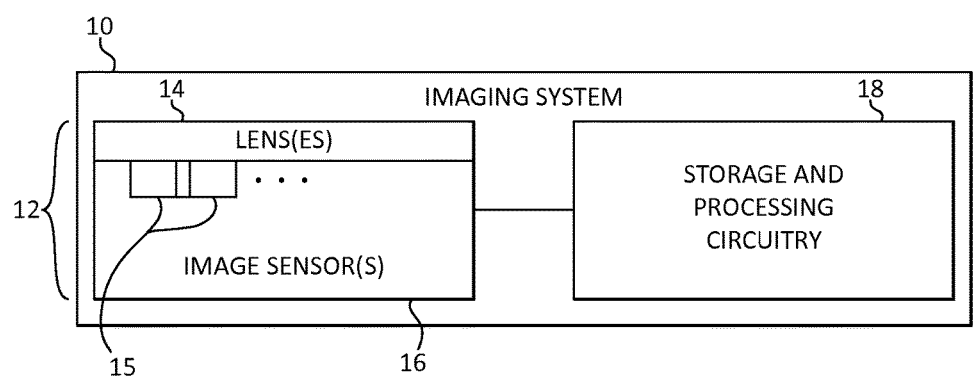
FIG. 1 is an illustrative imaging system that includes a camera module having an image sensor in accordance with an embodiment.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. Image sensor 16 may, for example, be a backside illumination (BSI) image sensor. If desired, camera module 12 may be provided with an array of lenses 14 and an array of corresponding image sensors 16. Image sensor 16 may include an array of image sensor pixels such as an array of image sensor pixels 15 and a corresponding array of color filter elements.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2A:
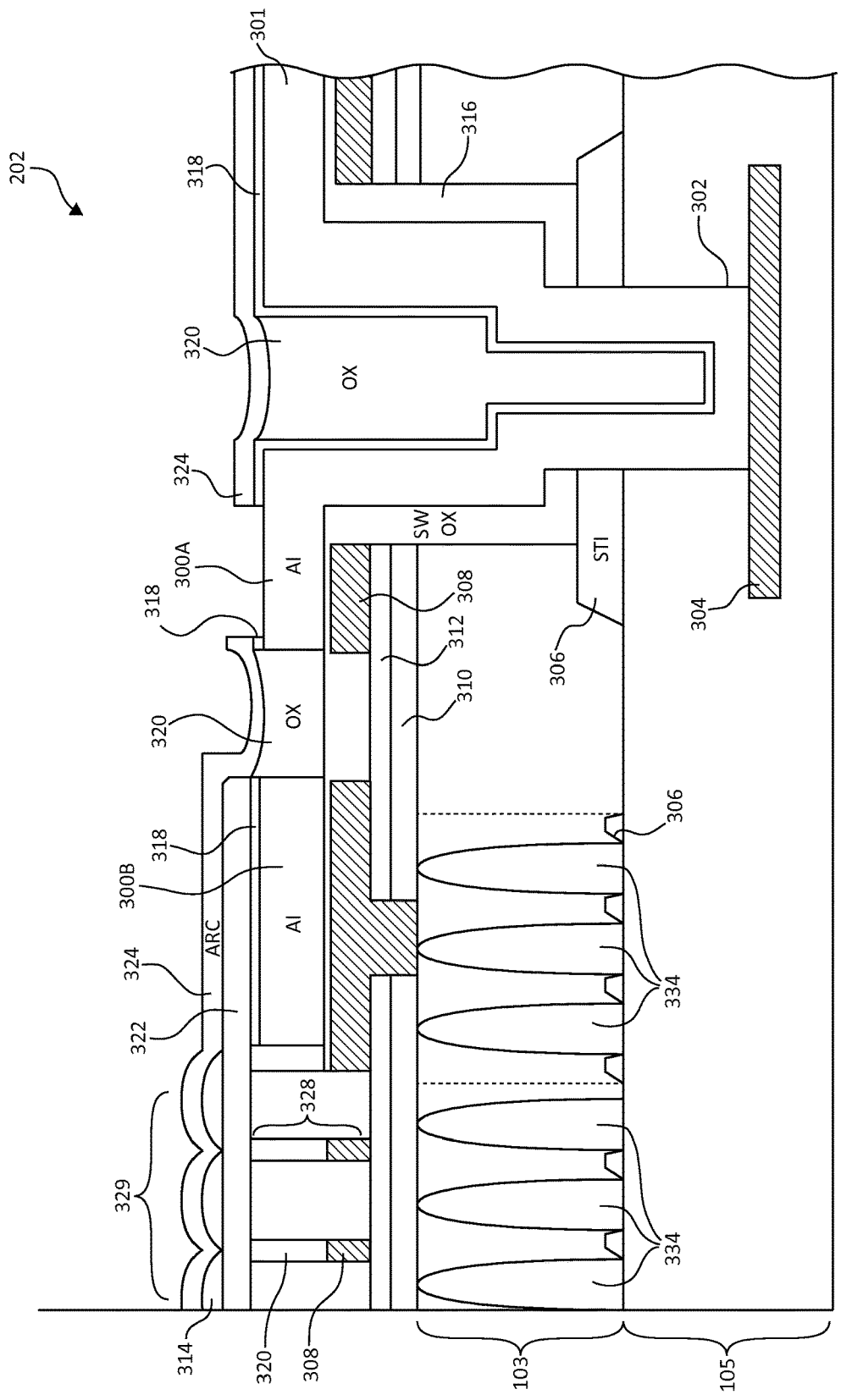
FIG. 2A is a cross-sectional view of an illustrative imaging system having a light shield grounded through the substrate in accordance with an embodiment.

FIG. 2A is a cross-sectional view of image sensor die 202. Image sensor die 202 may include a substrate 103 having a front surface and a back surface. Metal interconnect routing layer 105 may be formed on the front surface of the substrate 103. Layer 105 may include alternating metal interconnect routing structures 304 and via layers (not shown) formed over the front side of substrate 103. As shown in FIG. 2A, at least some of the front-side metal interconnect routing structures 304 may be coupled to through-oxide via (TOV) structures 302.

Photosensitive elements such as photodiodes 334 may be formed at the front surface of substrate 103. First photodiodes 334 that are formed in an "active" portion of image sensor 202 may receive incoming light and convert the incoming light into corresponding pixel signals, whereas second photodiodes 334' that are formed in a peripheral portion of image sensor 202 may not receive any incoming light as may serve as reference photodiodes for noise cancelling purposes (as an example). The first photodiodes 334 and the second photodiodes 334' are formed on the front side of substrate 103. Shallow trench isolation (STI) structures such as STI structures 306 may also be formed on the front surface of substrate 103 in between each adjacent pair of photodiodes. STI structures 306 may serve to ensure that the neighboring photodiodes are electrically isolated from one another.

A first dielectric layer 310 (e.g., a high-k layer formed from HfOx, TaOx, and a first oxide layer) may be formed over the backside of the substrate 103. A first passivation layer (e.g. a first nitride layer) 312 may be formed over the first oxide layer 310. Optionally, a portion of layers 310 and 312 are etched to create a contact region for a light shielding layer (e.g. a tungsten light shield) 308. The light shielding layer 308 may be shorted to ground through the substrate via the etched contact region.

A light shielding layer 308 may be formed on the first passivation layer 312. The light shielding layer 308 and the contact region may be formed simultaneously. A trench may then be etched through substrate 103. A second dielectric layer (e.g. sidewall oxide) 316 may be formed on the light shielding layer 308, with a portion extending into the trench. The light shielding layer 308, however, does not extend into the trench, and instead remains above the trench. A portion of the second dielectric layer 316 above the light shielding layer 308 may be etched for planarization.

A conductive layer (e.g. a layer of aluminum) 301 may then be formed on the back side of the substrate 103 on the second dielectric layer 316, a portion of which extends into the trench. The light shielding layer 308 remains interposed between the conductive layer 301 and the substrate 103. A second passivation layer (e.g. a nitride layer) 318 may be formed over the conductive layer 301.

The through-oxide via 302 may serve to couple the metal interconnect routing circuitry 304 to the conductive layer 301. The through-oxide via (or "TOV") may be formed through the shallow trench isolation (STI) structures 306 in order to couple the circuitry 304 to the conductive layer 301. A portion of the conductive layer 301 may then be etched to electrically isolate a first conductive portion 300B from a second conductive portion bond pad region 300A. The conductive portion 300B is connected to a ground bond pad (not shown in figure), while the light shield 308 may be coupled to ground through the substrate. Additionally, the conductive portion 300A coupled to metal routing structures 304, may be coupled to other power supply signals through a corresponding bond wire. However, this embodiment may not be limited to this configuration. For example, both the light shield 308 and the bond pad region 300A may both be shorted to ground.

Still referring to FIG. 2A, portions of the conductive layer 301 may be selectively etched to form an array of slots in which color filter wall structures 328 can be formed. A third dielectric layer (e.g. an oxide layer) 320 may then be formed over the conductive layer 301, and may also be formed in the trench. Dielectric material (e.g. oxide) may subsequently fill the array of slots to form color filter wall structures 328. Additionally, the dielectric material may fill the etched portion between the conductive region 300B and the conductive layer with the bond pad region 300A to keep the two portions electrically isolated. The third dielectric layer 320 undergoes chemical mechanical polishing (CMP) to reduce height and improve planarity.

The portions of the conductive layer 301 between the color filter wall structures 328 are selectively removed using a high aspect ratio etch to form an array of slots 329. This allows for the formation of color filter elements within the color filter wall structures 328. The color filter elements may be formed in the same layer as the conductive layer 301. An array of color filter elements formed within an associated housing structure can sometimes be collectively referred to as color filter array-in a-box or CFA-in-a-box (abbreviated as CIAB). The first photodiodes 334 which are beneath each corresponding color filter element, receive light through a light grid portion of the light shielding layer 308. The light shielding layer may be used as an in-pixel light grid above the active pixel region to mitigate high angle stray light. A planarization layer (e.g. a planar layer) 332 may then be formed on the color filter containment structures 328 and on the first portion of conductive layer 300B. After planar layer 332 is formed, microlenses such as microlenses 314 may then be formed over corresponding first photodiodes 334. Then, an antireflective coating (ARC) layer such as ARC layer 324 may be formed over the microlenses and the planar layer 332. ARC layer 324 may serve to ensure that the light entering substrate 103 from the back side is not reflected back towards the direction from which it arrived. A portion of the ARC layer 324 may then be etched to expose the second portion of the conductive layer 301 to serve as a bond pad region 300A.

Figure 2B:
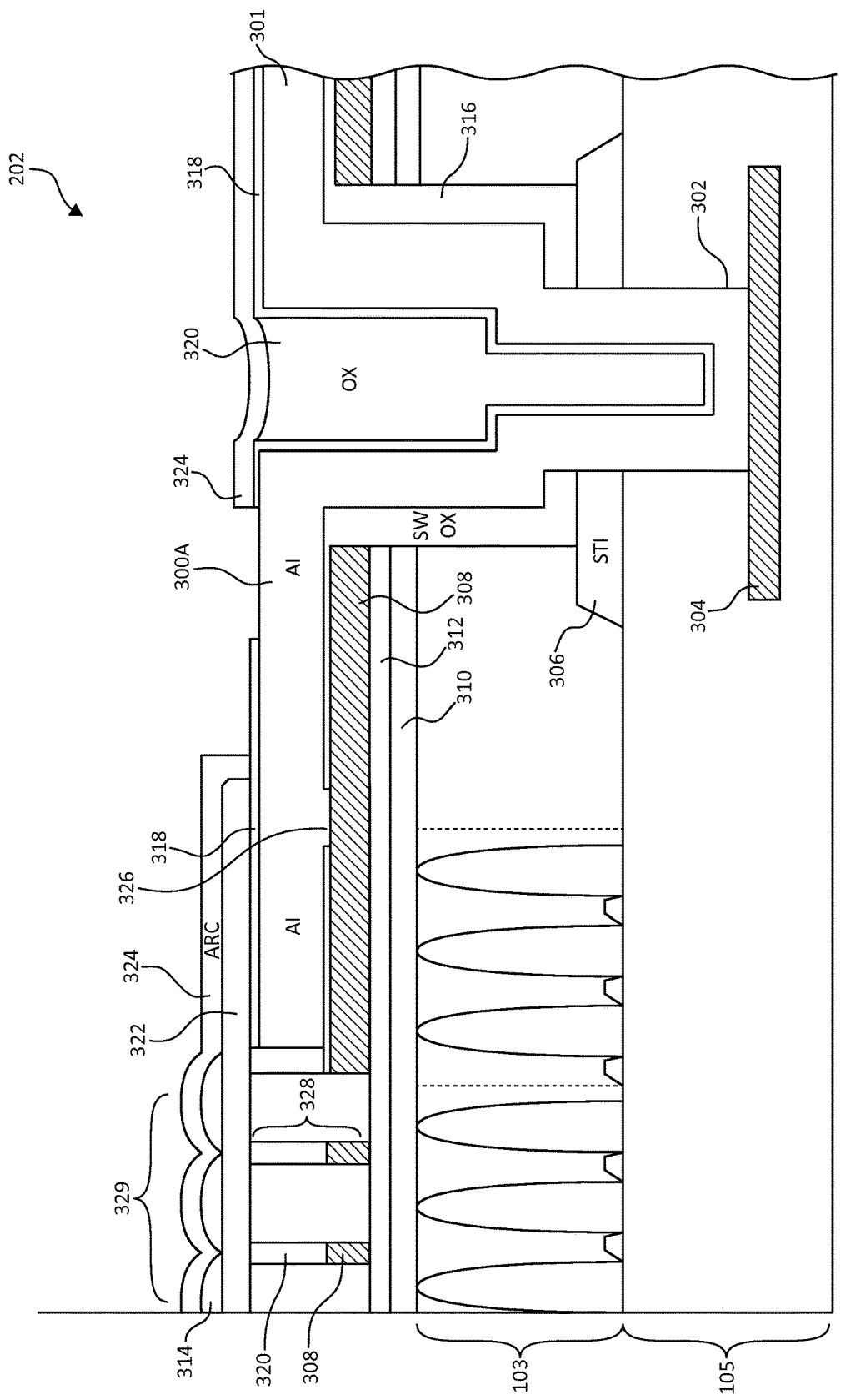
FIG. 2B is a cross-sectional view of an illustrative imaging system having a light shield grounded through a connection to a bond pad region in accordance with an embodiment.

FIG. 2B shows another suitable embodiment. In this embodiment, the conductive layer 301 is one continuous layer without being electrically isolated. The light shielding layer 308 is formed on the first passivation layer 312. A second dielectric layer (e.g. sidewall oxide) 316 may be formed on the light shielding layer 308. A contact region 326 may then be selectively etched in a portion of the dielectric layer 316. The conductive layer 301 may then be formed on the light shielding layer 308, with a portion extending into a trench. The portion which extends into the trench is coupled to a through-oxide via 302. The via 302 couples the conductive layer 301 to the metal interconnect structures 304. The light shielding layer 308 is coupled to the conductive layer 301 through region 326. The light shielding layer 308 may then be shorted (e.g. to ground) through the bond pad region 300A in conductive layer 301. In the example of FIG. 2B, 300A is coupled to metal routing structures 304, which may serve as a ground bond pad. Optionally, both the light shielding layer 308 and the conductive layer 301 may be coupled to other power supply signals.

Another embodiment not shown may optionally include the light shield 308 coupled to the substrate with a continuous conductive layer 301. The light shield 308 may be grounded through the substrate. The conductive layer may be grounded through the light shield 308.

Figure 3:
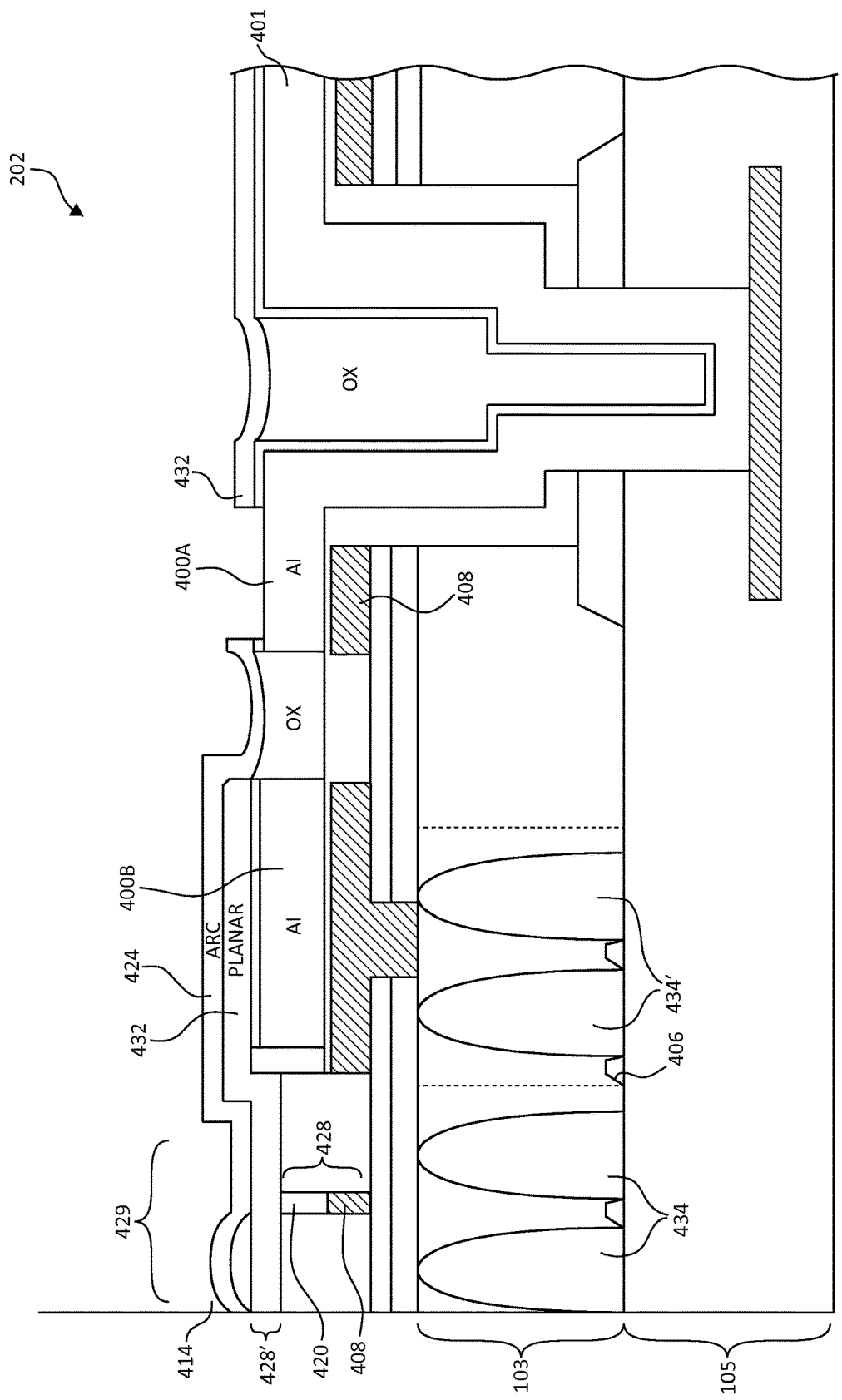
FIG. 3 is a cross-sectional view of an illustrative imaging system with recessed color filter array-in-a-box (CIAB) wall structures in accordance with another embodiment.

FIG. 3 shows another suitable embodiment. This cross-sectional view may include some or all of the features of FIG. 2A described above. Similar to FIG. 2A, FIG. 3 may have a conductive layer (e.g. an aluminum layer) 401, with a portion extending into a trench. The conductive layer 401 may have a first portion 400B that is electrically isolated by dielectric material (e.g. oxide) from a second portion in which there is a bond pad region 400A. A light shielding layer (e.g. tungsten layer) 408 may be interposed between the back side of substrate 103 and conductive layer 401, and remains above the trench. The light shield 408 may have a portion that extends into the backside of the substrate 103 and may be shorted to ground through the substrate.

Photosensitive elements such as photodiodes 434 may be formed at the front surface of substrate 103. First photodiodes 434 that are formed in an "active" portion of image sensor 202 may receive incoming light and convert the incoming light into corresponding pixel signals, whereas second photodiodes 434' that are formed in a peripheral portion of image sensor 202 may not receive any incoming light as may serve as reference photodiodes for noise cancelling purposes (as an example). The first photodiodes 434 and the second photodiodes 434' are formed on the front side of substrate 103.

Still referring to FIG. 3, portions of the conductive layer 401 may be selectively etched to form an array of slots in which color filter housing/wall structures can later be formed. A dielectric layer (e.g. an oxide layer) 420 may then be formed over the conductive layer 401. Dielectric material (e.g. oxide) may subsequently fill the array of slots to form color filter wall structures 428. Additionally, the dielectric material may fill the etched portion between the conductive region 400B and the conductive layer with the bond pad region 400A to keep the two portions electrically isolated. The third dielectric layer 420 undergoes chemical mechanical polishing (CMP) to reduce height and improve planarity.

The portions of the conductive layer 401 between the color filter wall structures 428 may then be selectively removed using a high aspect ratio etch to form an array of slots 429. This allows for the formation of color filter elements to be formed within the color filter wall structures 428. The color filter wall structures 428 may then be selectively recess etched without removing the conductive layer 401. As shown, the color filter wall structures 428 have a reduced height compared to a full height color filter wall structure, demonstrated by the line 428'. Color filter elements which correspond to their color filter wall structures 428 have an upper surface. The conductive layer 401 also has an upper surface.

In this embodiment, the upper surface of the conductive layer may extend above the upper surface of the color filter elements. First photodiodes 434 which are beneath each corresponding color filter element, receive light through a light grid portion of the light shielding layer 408. The light shielding layer may be used as an in-pixel light grid above the active pixel region to mitigate high angle stray light. A planarization layer (e.g. a planar layer) 432 may then be formed on the color filter containment structures 428 and on the first portion of conductive layer 400B. After planar layer 432 is formed, microlenses such as microlenses 414 may then be formed over corresponding first photodiodes 434. Then, an antireflective coating (ARC) layer such as ARC layer 424 may be formed over the microlenses and the planar layer 432. ARC layer 424 may serve to ensure that the light entering substrate 103 from the back side is not reflected back towards the direction from which it arrived.

Figure 4:
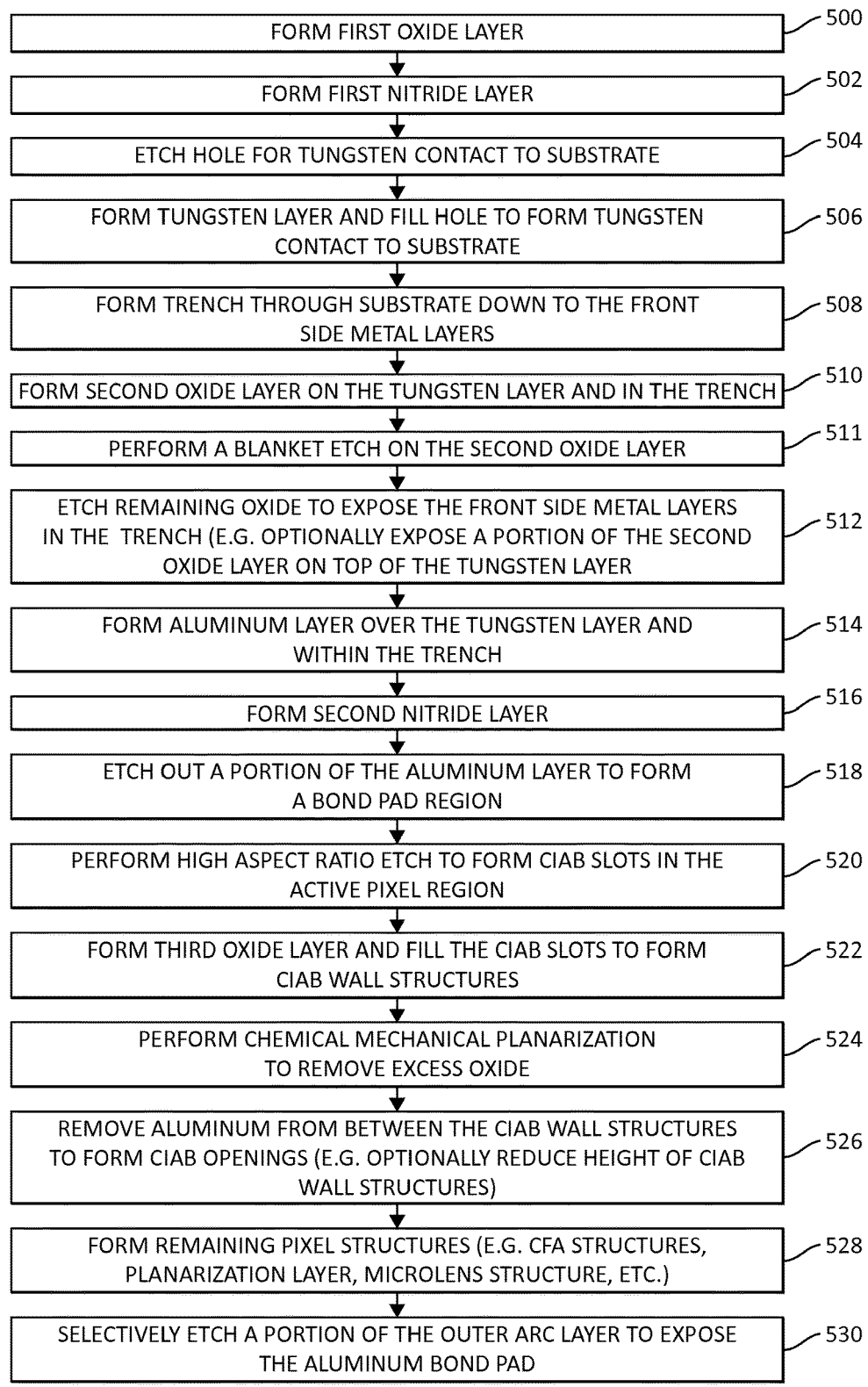
FIG. 4 is a flow chart of illustrative steps involved in forming image sensors of the type shown in FIGS. 3A, 3B, and 4 in accordance with an embodiment.

FIG. 4 is a flow chart of illustrative steps for manufacturing an imaging system of the type shown in at least FIGS. 2A, 2B, and 3. At step 500 a first dielectric layer (e.g., a high-k layer comprising of HfOx and TaOx and a first oxide layer) 310 may be formed on the back surface of a substrate 103. Prior to this step, photodiodes (334, 334' or 434, 434'), shallow trench isolation structures 304, other pixel circuitry, and associated routing circuitry may have already been formed. At step 502 a first passivation layer (e.g. a nitride layer) 312 may be formed on the first dielectric layer.

At step 504 a hole may be etched on a light shielding layer (e.g. tungsten layer 301 or 401) to form contact to the substrate. At step 508 a trench is formed through the substrate down to the front side metal layers 105. At step 510 a second oxide layer 316 may be formed on the light shielding layer and may extend into the trench as a sidewall passivation layer. At step 511 layer 316 may be blanket etched to reduce the thickness from the surface. This etch may also etch the sidewall oxide layer 316 at the bottom of the trench while keeping sidewall oxide layer 316 intact on the sidewall.

At step 512 the second oxide layer 316 at the bottom of the trench may be etched through the STI structures 306 to expose the front side metal layers 105 in the trench. This allows for the conductive layer 301 to couple to metal routing structures 304. Optionally, a portion of the second oxide layer 316 may be exposed on top of the light shielding layer.

At step 514 a conductive layer (e.g. aluminum layer 301 or 401) may be formed over the light shielding layer and within the trench. At step 516 a second passivation layer (e.g. nitride layer) may be formed. At step 518 a portion of the conductive layer may be etched to form a bond pad region (300A or 500A).

At step 520 a high aspect ratio etch may be performed to form an array of slots for color filter wall structures, also known as CIAB structures, in the active pixel region. At step 522 a third dielectric layer (e.g. oxide layer 320) is formed and simultaneously fills the color filter wall structures (328 or 428) the trench and any gaps in the conductive layer. At step 524 chemical mechanical planarization (CMP) is performed to remove any excess dielectric material.

At step 526 portions of the conductive layer between the color filter containment structures (328 or 428) are selectively removed to form an array of slots (329 or 429) for the color filter elements. At step 528 the remaining pixel structures are formed, for example the color filter array (CFA) structures, planarization layer, microlens structure, etc. At step 530 a portion of the outer anti reflective coating (ARC) layer (324 or 424) is selectively etched to expose the aluminum bond pad (300A or 400A).

Figure 5:
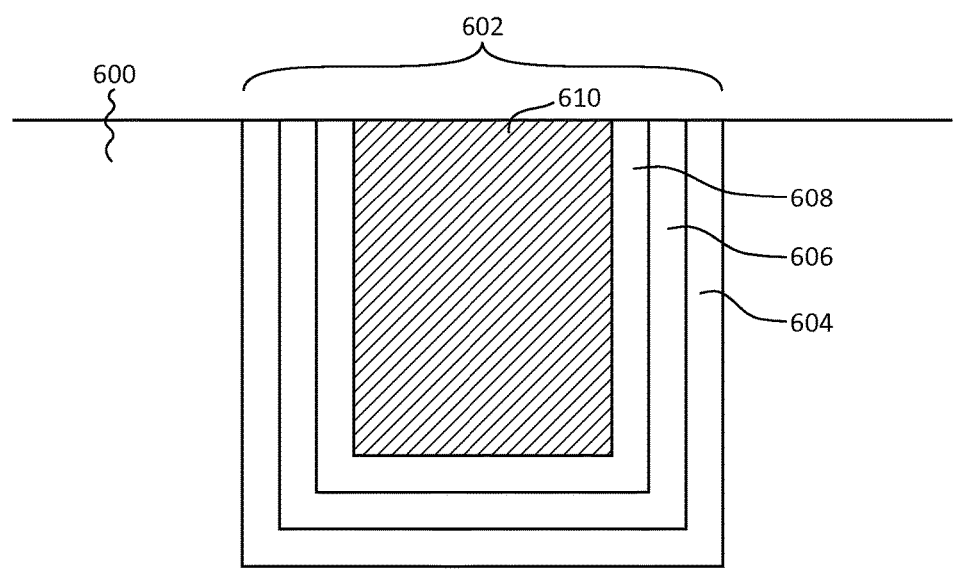
FIG. 5 is a cross-sectional view of a portion of a slot in which a color filter wall structure may be formed in accordance with an embodiment.

FIG. 5 is a cross-sectional view of a portion of a slot 602, which may be part of an array of slots in which the CIAB wall structures can be formed. For example, a portion such as this may be similar to color filter wall structure 328 in FIGS. 2A and 2B or wall structures 428 in FIG. 3. Conductive portion 600 may represent the surrounding conductive material prior to being etched to form the openings for the color filter elements (e.g. see step 526 in FIG. 4).

One or more gradient films (e.g., SiN, SiON, or any another suitable material with the desired refractive index), such as gradient films 604, 606, and 608, may be sequentially deposited within slot 602 via chemical vapor deposition (CVD), atomic layer deposition (ALD), or other types of film deposition. If desired, conductive material 610 may be used to fill any remaining cavity within slot 602 after the gradient films have been formed to help further reduce optical crosstalk between pixels in the pixel array. Conductive fill material 610 may include aluminum, tungsten, or any other suitable opaque fill material.

Gradient films 604, 606, 608 may have different refractive indices. Layers 604, 606, and 608 may represent monotonically increasing indices of refraction or monotonically decreasing indices of refraction, or may exhibit other patterns for achieving the desired optical characteristic. As an example, gradient film 604 may have an index of 1.2, film 606 may have an index 1.4, and film 608 may have an index of 1.6. These values are not limited to this example, however. If desired, the refractive indices may have any suitable value. In general, any number of film layers may be deposited with the color filter wall slots to help redirect light in the desired manner, to help reflect light, or to serve as an interference filter that exhibits desired spectral properties such as the ability to filter or absorb particular frequencies of light.

Figure 6:
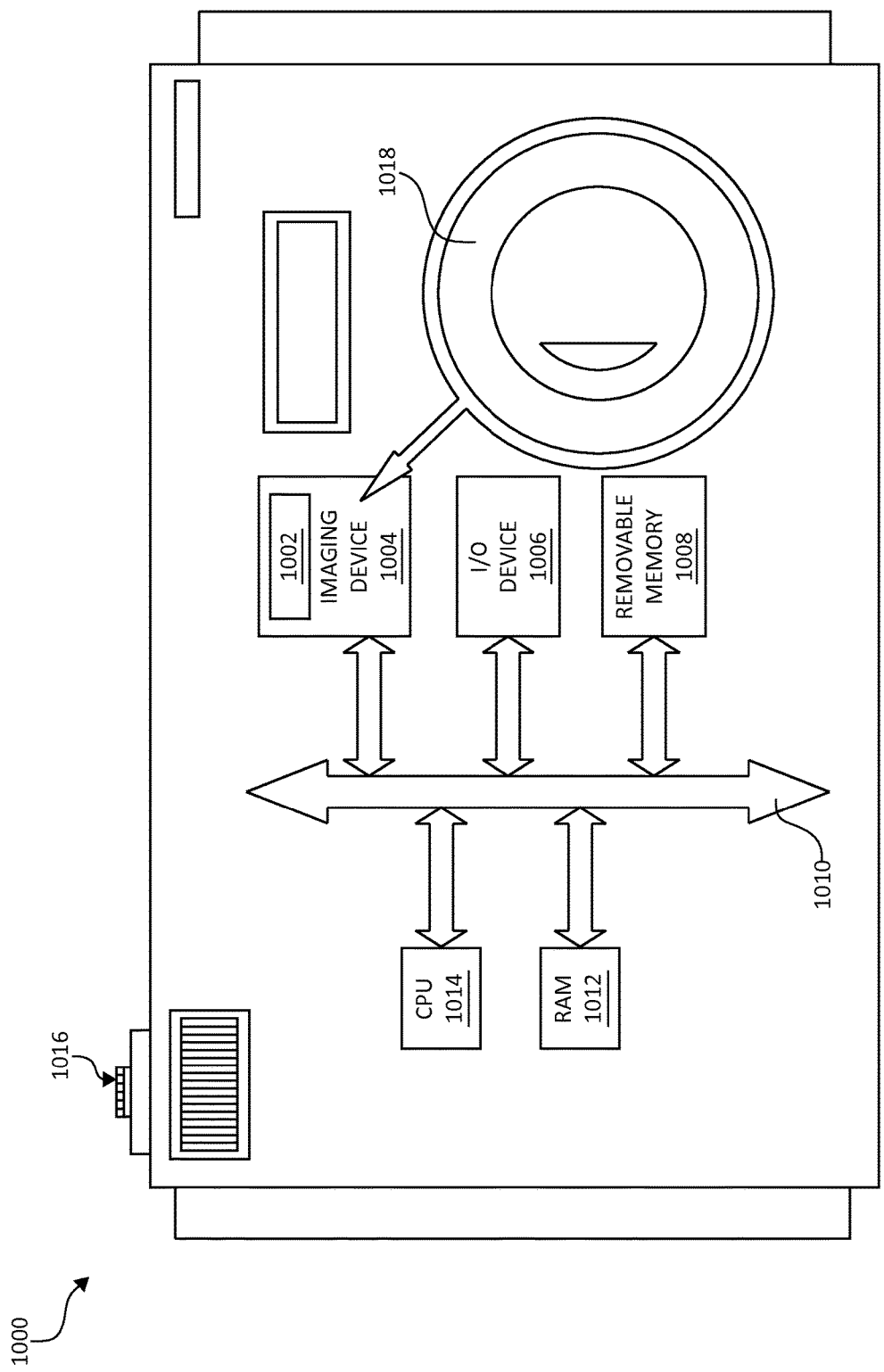
FIG. 6 is a block diagram of a system employing at least some of the embodiments of FIGS. 1-5 in accordance with an embodiment.

FIG. 6 shows in simplified form a typical processor system 1000, such as a digital camera, which includes an imaging device 1004. Imaging device 1004 may include a pixel array 1002 having pixels of the type shown in FIG. 1 (e.g., pixel array 1002 may be an array of image pixels formed on an image sensor SOC). Processor system 1000 is exemplary of a system having digital circuits that may include imaging device 1004. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 1000, which may be a digital still or video camera system, may include a lens such as lens 1018 for focusing an image onto a pixel array when shutter release button 1016 is pressed. Processor system 1000 may include a central processing unit such as central processing unit (CPU) 1014. CPU 1014 may be a microprocessor that controls camera functions and one or more image flow functions and communicates with one or more input/output (I/O) devices 1006 over a bus such as bus 1010. Imaging device 1004 may also communicate with CPU 1014 over bus 1010. System 1000 may include random access memory (RAM) 1012 and removable memory 1008. Removable memory 1008 may include flash memory that communicates with CPU 1014 over bus 1010. Imaging device 1004 may be combined with CPU 1014, with or without memory storage, on a single integrated circuit or on a different chip. Although bus 1010 is illustrated as a single bus, it may be one or more buses or bridges or other communication paths used to interconnect the system components.

Various embodiments have been described illustrating an electronic device (see, e.g., device 10 of FIG. 1) that includes an imaging system and host subsystems. An imaging system may include one or more image sensors. Each image sensor may include an array of image pixels formed on a semiconductor substrate. Each image pixel may include one or more photosensitive elements configured to convert incoming light into electric charges.

The image sensor die maybe a backside illuminated (BSI) image sensor and may include a substrate having front and back surfaces, a plurality of imaging pixels, photosensitive elements, shallow trench isolation (STI) structures, and interconnect routing layers formed at the front surface of the substrate and may also include color filter containment structures, a light shielding layer (e.g. tungsten), a conductive layer (e.g., an aluminum layer) over the light shielding layer, and a layer of antireflective coating (ARC) material formed over the back surface of the substrate. The image sensor may further include a first dielectric layer formed on the ARC layer, a first passivation layer formed on the first dielectric layer, a second dielectric layer formed on the first passivation layer, a second passivation layer formed on the second dielectric layer, and a third dielectric layer formed on the second passivation layer. The first, second, and third dielectric layers may be formed from oxide, whereas the first and second passivation layers may be formed from nitride or other suitable materials (as examples).

A light shielding layer may be formed over the first passivation, a portion of which may extend to the back side of the substrate. First photodiodes formed in the substrate may receive light through a light grid portion of the light shielding layer. Second photodiodes also formed in the substrate may be covered with a portion of the light shielding layer. A conductive layer having an upper surface may be formed on the light shielding layer. Optionally, the light shielding layer may be shorted to ground through a bond pad region of the conductive layer. Color filter elements having an upper surface may be formed in the same layer as the conductive layer. Optionally, the upper surface of the conductive layer may be above the upper surface of the color filter elements.

The substrate may also have metal interconnect routing structures formed on its front side. A trench may be formed in the substrate, and may subsequently have a portion of the conductive layer extending through it, while the light shielding layer may remain above the trench. A conductive via may be formed within the trench, and may extend from a portion of the conductive layer. This via may be coupled to the metal interconnect routing structures. The via and the conductive layer may be formed from the same conductive material simultaneously.

The foregoing is merely illustrative of the principles of this invention and various modifications can be made by those skilled in the art without departing from the scope and spirit of the invention. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. Imaging circuitry, comprising:
   a substrate;
   a first plurality of photodiodes in the substrate;
   a second plurality of photodiodes in the substrate;
   a light shielding layer on the substrate, wherein the light shielding layer has a shielding portion that covers the first plurality of photodiodes and shields the first plurality of photodiodes from receiving incoming light, wherein the light shielding layer has a grid portion that covers the second plurality of photodiodes, and wherein the second plurality of photodiodes receives incoming light through the grid portion;
   a conductive layer over the light shielding layer, wherein a portion of the conductive layer serves as a bond pad region; and
   a dielectric layer interposed between the conductive layer and the light shielding layer, wherein the dielectric layer has an opening and the conductive layer and the shielding portion are electrically connected through the opening.

2. The imaging circuitry defined in claim 1, further comprising:
   color filter elements, wherein the color filter elements and the conductive layer are coplanar.

3. The imaging circuitry defined in claim 1, wherein the light shielding layer is shorted to ground through the bond pad region.

4. The imaging circuitry defined in claim 1, further comprising:
   a trench in the substrate, wherein the conductive layer extends into the trench.

5. The imaging circuitry defined in claim 4, wherein the light shielding layer remains above the trench.

6. The imaging circuitry defined in claim 1, wherein the conductive layer comprises an aluminum layer, and wherein the light shielding layer comprises a tungsten layer.

7. The imaging circuitry defined in claim 1, wherein the conductive layer extends substantially across an upper surface of the substrate.

8. The imaging circuitry defined in claim 1, wherein the conductive layer extends through the opening in the dielectric layer to directly contact the shielding portion.

9. The imaging circuitry defined in claim 1, wherein each photodiode of the second plurality of photodiodes is aligned with a respective opening in the grid portion of the light shielding layer.

10. A system, comprising:
a central processing unit;
memory;
a lens;
input-output circuitry; and
an imaging device, wherein the imaging device comprises:
  a substrate with first and second opposing sides;
  a conductive layer that is formed over the first side of the substrate, wherein a portion of the conductive layer serves as a bond pad region;
  a first plurality of photodiodes;
  color filter containment structures that are formed in the same layer as the conductive layer, wherein the color filter containment structures are formed over the first plurality of photodiodes;
  a second plurality of photodiodes;
  a light shielding layer interposed between at least a portion of the conductive layer and the substrate, wherein the light shielding layer has a first portion that covers the second plurality of photodiodes and shields the second plurality of photodiodes from incoming light and a second portion with openings that allow incoming light to reach the first plurality of photodiodes; and
  a metal interconnect routing layer formed on the second side of the substrate, wherein the metal interconnect routing layer includes a metal interconnect structure, wherein the conductive layer is electrically connected to the metal interconnect structure, and wherein the first portion of the light shielding layer is electrically connected to the metal interconnect structure through the conductive layer without directly contacting the metal interconnect structure.

11. The system defined in claim 10, wherein the imaging device further comprises:
a planar layer formed on the color filter containment structures and the conductive layer.

12. The system defined in claim 10, further comprising:
a dielectric layer interposed between the conductive layer and the light shielding layer, wherein the dielectric layer has an opening and wherein the conductive layer and the first portion of the light shielding layer are electrically connected through the opening.

13. The system defined in claim 10, wherein the portion of the conductive layer that serves as the bond pad region is interposed on an electrical path between the light shielding layer and the metal interconnect structure.

14. Imaging circuitry, comprising:
a substrate;
a first plurality of photodiodes in the substrate;
a second plurality of photodiodes in the substrate;
a light shielding layer on the substrate, wherein the light shielding layer has a shielding portion that covers the first plurality of photodiodes and shields the first plurality of photodiodes from receiving incoming light, wherein the light shielding layer has a grid portion that covers the second plurality of photodiodes, and wherein the second plurality of photodiodes receives incoming light through the grid portion;
a conductive layer over the light shielding layer, wherein a portion of the conductive layer serves as a bond pad region;
a dielectric layer interposed between the conductive layer and the light shielding layer, wherein the dielectric layer has an opening and the conductive layer and the shielding portion are electrically connected through the opening; and
metal interconnect structures, wherein the conductive layer is electrically connected to the metal interconnect structures and wherein the light shielding layer is electrically connected to the metal interconnect structures through the conductive layer without directly contacting the metal interconnect structures.

15. The imaging circuitry defined in claim 14, wherein the substrate has first and second opposing sides, wherein the conductive layer is on the first side of the substrate, and wherein the metal interconnect structures are on the second side of the substrate.

* * * * *